US009590087B2

(12) United States Patent
Werner et al.

(10) Patent No.: US 9,590,087 B2
(45) Date of Patent: Mar. 7, 2017

(54) COMPOUND GATED SEMICONDUCTOR DEVICE HAVING SEMICONDUCTOR FIELD PLATE

(71) Applicant: Infineon Technologies Austria AG, Villach (AT)

(72) Inventors: Wolfgang Werner, Munich (DE); Frank Kahlmann, Neubiberg (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 9 days.

(21) Appl. No.: 14/540,535

(22) Filed: Nov. 13, 2014

(65) Prior Publication Data

US 2016/0141405 A1    May 19, 2016

(51) Int. Cl.
*H01L 29/778* (2006.01)
*H01L 29/40* (2006.01)
(Continued)

(52) U.S. Cl.
CPC ...... *H01L 29/7786* (2013.01); *H01L 29/0623* (2013.01); *H01L 29/0657* (2013.01); *H01L 29/205* (2013.01); *H01L 29/407* (2013.01); *H01L 29/43* (2013.01); *H01L 29/66431* (2013.01); *H01L 29/66462* (2013.01); *H01L 29/0634* (2013.01); *H01L 29/0843* (2013.01); *H01L 29/2003* (2013.01); *H01L 29/42316* (2013.01)

(58) Field of Classification Search
CPC .............. H01L 29/7786; H01L 29/407; H01L 29/66431
See application file for complete search history.

(56) References Cited

U.S. PATENT DOCUMENTS 7,863,648 B2    1/2011  Miyamoto et al.
7,928,475 B2    4/2011  Parikh et al.
(Continued)

OTHER PUBLICATIONS

Ambacher, et al., "Two-dimensional Electron Gases Introduced by Spontaneous and Piezoelectric Polarization Charges in N- and Ga-face AlGaN/Gan Heterostructures", Journal of Applied Physics, vol. 85, No. 6, Mar. 15, 1999, American Institute of Physics, pp. 3222-3233.

(Continued)

*Primary Examiner* — Michael Jung
(74) *Attorney, Agent, or Firm* — Murphy, Bilak & Homiller, PLLC (57) ABSTRACT

A transistor includes a source, a drain spaced apart from the source, and a heterostructure body having a two-dimensional charge carrier gas channel for connecting the source and the drain. The transistor further includes a semiconductor field plate disposed between the source and the drain. The semiconductor field plate is configured to at least partly counterbalance charges in the drain when the transistor is in an off state in which the channel is interrupted and a blocking voltage is applied to the drain. The counterbalance charge provided by the semiconductor field plate is evenly distributed over a plane or volume of the semiconductor field plate. Various semiconductor field plate configurations and corresponding manufacturing methods are described herein.

9 Claims, 7 Drawing Sheets

(51) Int. Cl.
  *H01L 29/66* (2006.01)
  *H01L 29/43* (2006.01)
  *H01L 29/06* (2006.01)
  *H01L 29/205* (2006.01)
  *H01L 29/423* (2006.01)
  *H01L 29/08* (2006.01)
  *H01L 29/20* (2006.01)

(56) References Cited

U.S. PATENT DOCUMENTS

| | | | |
|---|---|---|---|
| 8,530,936 | B2 | 9/2013 | Ishii |
| 8,759,879 | B1* | 6/2014 | Tipirneni .......... H01L 29/41766 257/190 |
| 9,093,512 | B2 | 7/2015 | Ohki |
| 2005/0189559 | A1 | 9/2005 | Saito et al. |
| 2010/0258912 | A1 | 10/2010 | Beach et al. |
| 2010/0314666 | A1 | 12/2010 | Saito et al. |
| 2011/0303952 | A1* | 12/2011 | Hwang ................ H01L 29/267 257/194 |
| 2013/0153967 | A1 | 6/2013 | Curatola et al. |
| 2013/0200389 | A1 | 8/2013 | Lee |
| 2014/0042448 | A1* | 2/2014 | Ostermaier ....... H01L 29/41766 257/76 |
| 2014/0312362 | A1 | 10/2014 | Makiyama |
| 2015/0140745 | A1 | 5/2015 | Hsu |
| 2015/0194513 | A1* | 7/2015 | Curatola ............. H01L 29/7786 257/76 |
| 2015/0318360 | A1* | 11/2015 | Lu ....................... H01L 21/8258 257/192 |

OTHER PUBLICATIONS

Bahat-Treidel, et al., "Punchthrough-Voltage Enhancement of AlGaN/GaN HEMTs Using AlGaN Double-Heterojunction Confinement", IEEE Transactions on Electron Devices, vol. 55, No. 12, Dec. 2008, pp. 3354-3359.

Kocan, Martin, "AlGaN/GaN MBE 2DEG Heterostructures: Interplay between Surface-, Interface and Device-Properties", Institut für Schichten und Grenzflächen, Dissertation, Jul. 16, 2003, pp. 1-219.

* cited by examiner

Figure 6
Line A-A'

Figure 7
Line B-B'

COMPOUND GATED SEMICONDUCTOR DEVICE HAVING SEMICONDUCTOR FIELD PLATE

TECHNICAL FIELD

The present application relates to compound semiconductor devices, in particular field plates for compound semiconductor devices.

BACKGROUND

Gate electrodes made of highly conductive materials such as metals, silicides or highly doped poly-silicon, positioned between the source and drain electrode, are used to control the two-dimensional charge carrier gas channel in wide bandgap semiconductor devices based on GaN or GaAs layers. The gate electrodes typically form a Schottky diode on top of the two-dimensional charge carrier gas channel, or are separated from the two-dimensional charge carrier gas channel by an insulating material such as $SiO_2$ and/or a thin GaN or AlGaN layer. By applying a negative voltage to the gate, the underlying two-dimensional charge carrier gas channel is disrupted and as a consequence the transistor is in a blocking state.

With GaN HEMTs (high electron mobility transistors), the net charge of the gate or field electrode only depends on the capacity of the electrode with respect to its surrounding area and the applied voltage. In case a blocking voltage is applied to the drain electrode, almost the complete mirror charge in the form of free electrons is provided on the field electrode. The mirror charge counterbalances the opposite charge that builds up within the drain in the transistor blocking state, so as to bring about electrical equilibrium within the device. If there is no field electrode present, the complete mirror charge is provided on the gate electrode. Owing to the highly mobile nature of free electrons in metals, the mirror charge is almost completely positioned on the side of the electrode (field or gate electrode) facing the drain electrode. The mirror charges concentrate almost to a point at the drain edge of the electrode, causing very high electric field peaks particularly towards the drain edge of the electrode. These high electric field peaks cause the injection of charge carriers into neighboring insulating layers and interfaces between layers of different materials, respectively, thereby changing the static and dynamic electrical behavior of the transistor. Such trapping effects are detrimental to device operation.

SUMMARY

According to an embodiment of a transistor, the transistor comprises a source, a drain spaced apart from the source, a heterostructure body, and a semiconductor field plate. The heterostructure body includes a two-dimensional charge carrier gas channel for connecting the source and the drain. The semiconductor field plate is disposed between the source and the drain. The semiconductor field plate is configured to at least partly counterbalance charges in the drain when the transistor is in an off state in which the channel is interrupted and a blocking voltage is applied to the drain. The counterbalance provided by the semiconductor field plate is evenly distributed over a plane or volume of the semiconductor field plate.

According to another embodiment of a transistor, the transistor comprises a source, a drain spaced apart from the source, a heterostructure body, and a doped semiconductor field plate. The heterostructure body includes a two-dimensional charge carrier gas channel for connecting the source and the drain. The doped semiconductor field plate is included in the heterostructure body. The doped semiconductor field plate comprises dopant atoms distributed evenly throughout a volume of the semiconductor field plate and is configured to at least partly counterbalance charges in the drain when the transistor is in an off state and a blocking voltage is applied to the drain.

According to an embodiment of a method of manufacturing a transistor, the method comprises: forming a heterostructure body that includes a two-dimensional charge carrier gas channel for connecting a source and a drain of the transistor; introducing dopant atoms into a region of the heterostructure body; and thermally activating the dopant atoms such that the dopant atoms occupy crystal lattice positions within the heterostructure body and form a semiconductor field plate between the source and the drain, the dopant atoms of the semiconductor field plate configured to at least partly counterbalance charges in the drain when the transistor is in an off state and a blocking voltage is applied to the drain.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 4, which includes

DETAILED DESCRIPTION

The embodiments described herein provide a semiconductor field plate that reduces electric field buildup in a compound semiconductor transistor when the transistor is off and in a blocking state. The field plate provides immobile (fixed) mirror charges that counterbalance charges of the opposite polarity that buildup within the drain in the blocking state. The mirror charges are evenly distributed over the volume of the field plate in the case of the doped semiconductor field plate embodiment described herein, or over a plane of the field plate in the case of the two-dimensional charge carrier gas field plate embodiment described herein.

In each case, mobile free charge carriers are forced out of the field plate in the blocking state such that the remaining mirror charges provided by the field plate are immobile and fixed in space. This way the mirror charges do not migrate towards the side of the field plate facing the drain, but rather are distributed more evenly within the field plate. The term 'mirror charges' as used herein refers to immobile charges available in the field plate for counterbalancing charges of the opposite polarity that buildup in the drain when the transistor is off and in the blocking state. In the case of an n-channel transistor, the drain becomes positively charged in the blocking state and the mirror charges have a negative polarity. In the case of a p-channel transistor, the drain becomes negatively charged in the blocking state and the mirror charges have a positive polarity. In either case, a significant reduction in electric field buildup is realized by using a semiconductor field plate with evenly distributed mirror charges that do not crowd in the edge of the field plate towards the drain.

Figure 1:
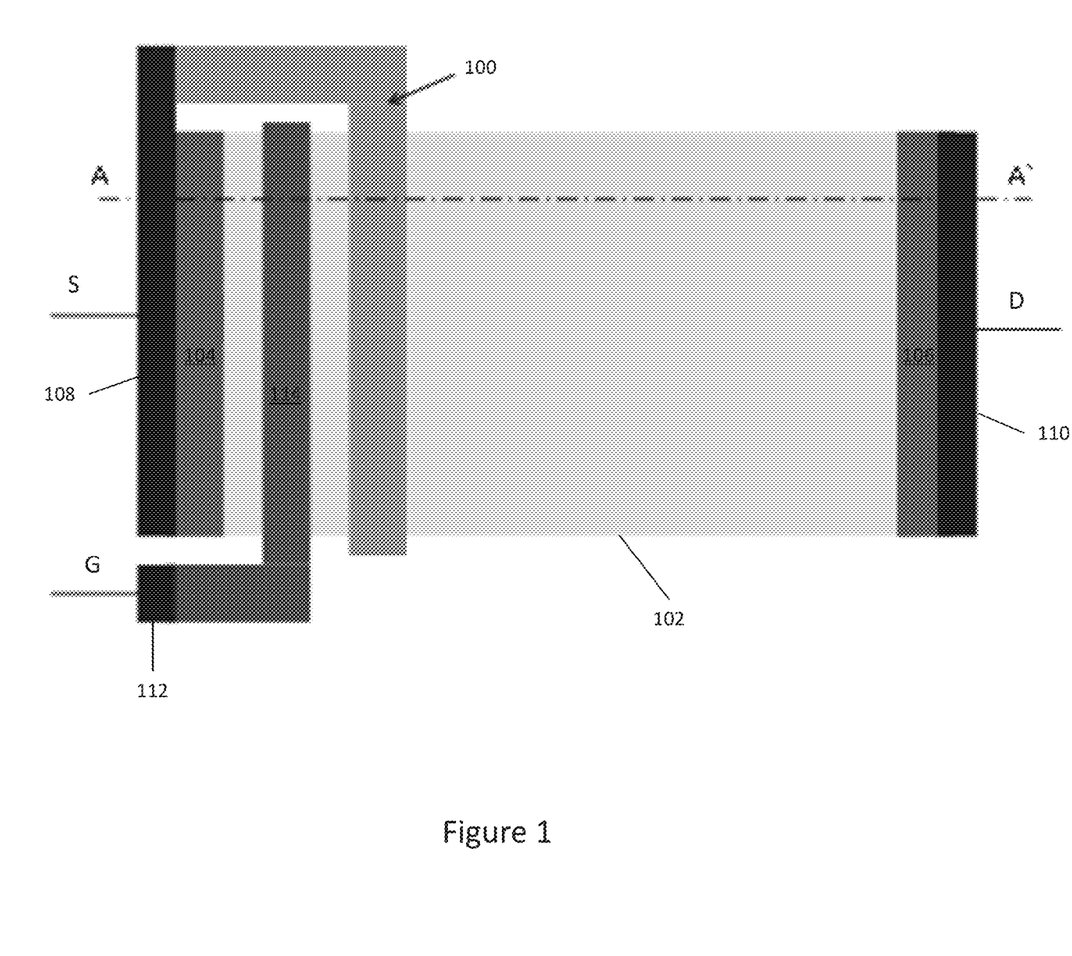
FIG. 1 illustrates a top plan view of an embodiment of a compound semiconductor transistor having a semiconductor field plate with evenly distributed mirror charges.

FIG. 1 illustrates a top plan view of one embodiment of a compound semiconductor transistor having a semiconductor field plate 100 with evenly distributed mirror charges. According to this embodiment, the transistor comprises a heterostructure body 102 that includes a source 104/108, a drain 106/110 spaced apart from the source 104/108, and a two-dimensional charge carrier gas channel (out of view) for (electrically) connecting the source 104/108 and the drain 106/110. For example in the case of an n-channel HEMT, the source 104/108 and the drain 106/110 are connected via a two-dimensional electron gas (2DEG) channel. In the case of a p-channel HEMT, the source 104/108 and the drain 106/110 are connected via a two-dimensional hole gas (2DHG) channel. The terms 'source' and 'drain' as used herein refer to respective doped regions 104, 106 of the device and/or to respective source/drain electrodes (contacts) 108, 110 e.g. if no doped regions are provided. For example, typical HEMTs have source and drain ohmic contacts (electrodes) 108, 110 which are based on a metal alloy that does not require any additional doping. There is also the option to dope the source and drain region of the device e.g. with Si to have an n+ region 104, 106 below the corresponding ohmic contact 108, 110 and to lower, therefore, the overall contact resistance e.g. in the case of high voltage transistors. As such, the terms 'source' and 'drain' as used herein can refer to just the corresponding source/drain electrode (ohmic contact) 108, 110, the corresponding source/drain doped region 104, 106 if provided, or both. The gate 114 can be a planar or trench gate in direct contact with the heterostructure body 102 or electrically insulated from the heterostructure body 102.

The semiconductor field plate 100 is disposed between the source 104/108 and the drain 106/110. The field plate 100 is made of semiconductor material instead of metal. The semiconductor field plate 100 can be electrically connected to the source 102 e.g. via the source electrode 108, and is configured to at least partly counterbalance charges in the drain 106/110 when the transistor is in the off state i.e. the channel is interrupted and a blocking voltage is applied to the drain 106/110. In the case of an n-channel HEMT, a large positive voltage (e.g. 600V) is applied to the drain 106/110 in the blocking state. Under these conditions, mobile free charge carriers are forced out of the drain 106/110 to the source 104/108. For example in the case of an n-channel transistor, free electrons are forced out of the drain 106/110 to the source 104/108 and the fixed (immobile) atoms in the drain 106/110 yield a net positive charge. In the case of a p-channel transistor, free holes are forced out of the drain 106/110 to the source 104/108 and the fixed atoms in the drain 106/110 yield a net negative charge.

Evenly distributed mirror charges in the semiconductor field plate 100 counterbalance the opposite charges in the drain 106/110 in the blocking state. These mirror charges are immobile and fixed in space because most, if not all, of the mobile free charge carriers are likewise forced out of the field plate 100 in the blocking state such that the field plate 100 becomes charged opposite as the drain 106/110. For example in the case of a p-doped field plate 100, free holes are forced out of the field plate 100 in the blocking state such that the field plate becomes negatively charged. In the case of an n-doped field plate 100, free electrons are forced out of the field plate 100 in the blocking state such that the field plate 100 becomes positively charged. The charge counterbalance provided by the semiconductor field plate 100 is evenly distributed over a plane or volume of the semiconductor field plate 100, depending on the specific implementation of the field plate 100.

Figure 2:
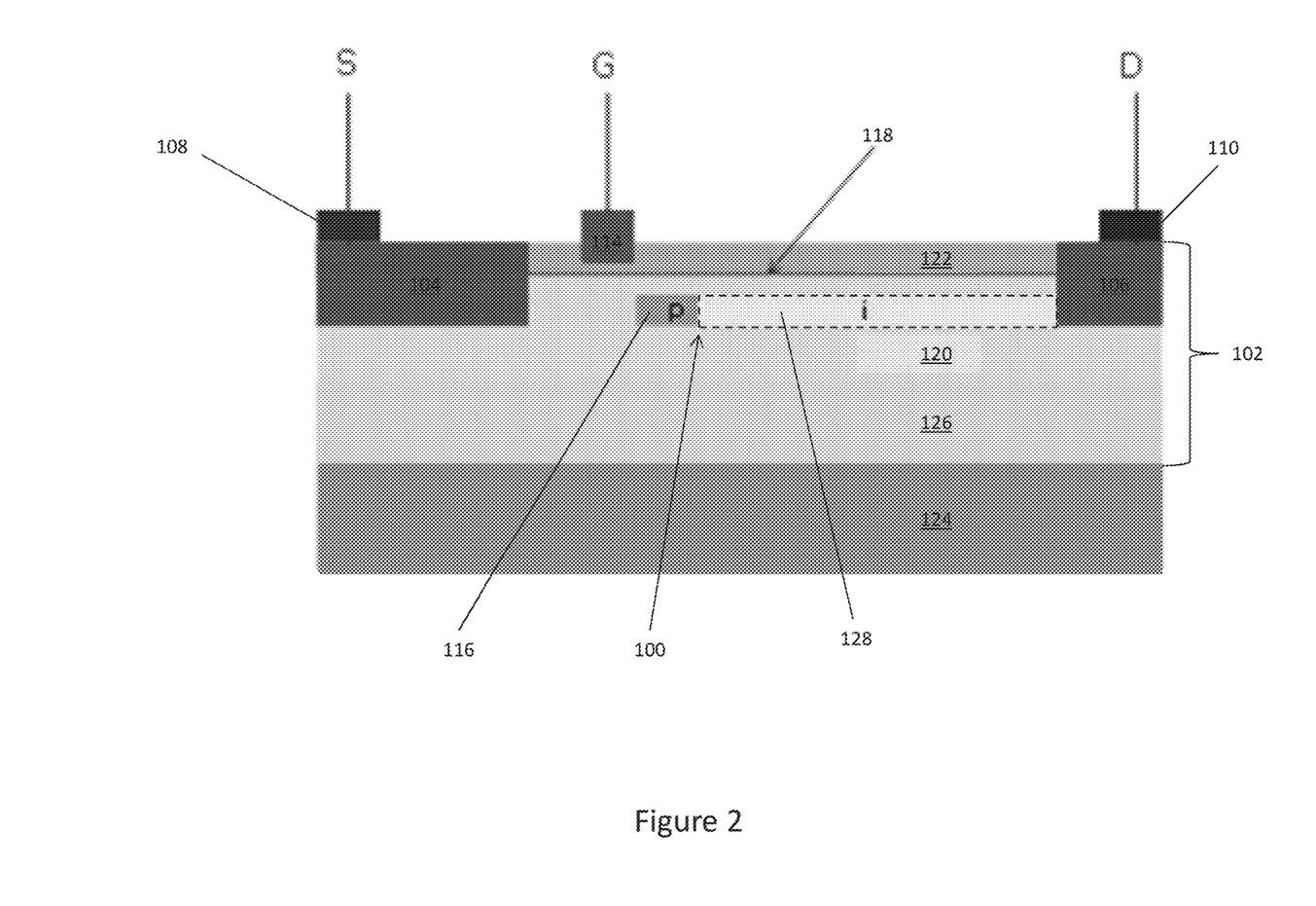
FIG. 2 illustrates a sectional view of the compound semiconductor transistor shown in FIG. 1 along the line labeled A-A'.

FIG. 2 is a sectional view of the transistor along the line labeled A-A' in FIG. 1, and illustrates one embodiment of the semiconductor field plate 100. According to this embodiment, the semiconductor field plate 100 comprises a doped region 116 of the heterostructure body 102. In the case of an n-channel device as shown, the semiconductor field plate 100 comprises a p-doped region 116 in the heterostructure body 102. In the case of a p-channel device, the semiconductor field plate 100 comprises an n-doped region 116 in the heterostructure body 102. In both cases, the doping concentration and size of this doped region 116 or, in other words, the total amount of activated donor atoms (acceptor atoms for an n-channel device; donor atoms for a p-channel device) inside the doped region 116 can be chosen such that the doped region 116 is not fully depleted when the maximum blocking voltage is applied to the drain 106/110.

In the blocking state, the immobile mirror charges provided by the field plate 100 originate from the dopant atoms in the doped region 116 of the heterostructure body 102 which were activated to form the field plate 100. Because the dopant atoms are located on crystal lattice positions within the heterostructure body 102, they are fixed in space and therefore immobile. As such, when mobile free charge carriers are forced out of the field plate 100 in the blocking state, the mirror charges that remain are the dopant atoms which are immobile and fixed in space. These immobile mirror charges counterbalance the charges of the drain 106/110, and are evenly distributed over the volume of the doped region 116 according to this embodiment. As a result, significantly reduced maximum electric fields arise within the heterostructure body 102 in the blocking state as compared to conventional metal electrodes. The doped region 116 of the semiconductor field plate 100 can be connected to the source electrode 108 e.g. via another doped region. Alternatively, the doped region 116 of the semiconductor field plate 100 can be contacted towards the source 104/108 via a separate metallic electrode.

The doped region 116 of the semiconductor field plate 100 can be disposed in the heterostructure body 102 below the two-dimensional charge carrier gas channel 118 as shown in FIG. 2. In one embodiment, the heterostructure body 102 comprises a first III-nitride semiconductor 120 (also referred to interchangeably herein as a buffer layer) and a second III-nitride semiconductor 122 (also referred to interchangeably herein as a barrier layer) on the first III-nitride semiconductor 120. The barrier layer 122 can be grown on the buffer layer 120 using any standard epitaxy process. The barrier layer 122 has a different band gap than the buffer layer 120, such that a two-dimensional charge carrier gas 118 extends along the interface between the buffer and barrier layers 120, 122. The two-dimensional charge carrier gas 118 arises near the junction between the two III-nitride semiconductors 120, 122, and forms the channel 118 of the device.

Specifically with regard to GaN technology, the presence of polarization charges and strain effects in a GaN-based heterostructure body due to spontaneous and piezoelectric polarization yield a two-dimensional charge carrier gas in the heterostructure body characterized by very high carrier density and carrier mobility. This two-dimensional charge carrier gas, such as a 2DEG or 2DHG, forms the conductive channel 118 of the device near the interface between, e.g., a GaN alloy barrier layer 122 such as AlGaN or InAlGaN and a GaN buffer layer 120. A thin, e.g. 1-2 nm, AlN layer can be provided between the GaN buffer layer 120 and the GaN alloy barrier layer 122 to minimize alloy scattering and enhance 2DEG mobility. In a broad sense, the compound semiconductor transistor described herein can be formed from any binary, ternary or quaternary III-nitride compound semiconductor material where piezoelectric effects are responsible for the device concept. The GaN buffer layer 120 can be manufactured on a semiconductor substrate 124 such as a Si or SiC substrate, on which a nucleation (seed) layer 126 such as an AlN layer can be formed for providing thermal and lattice matching to the GaN buffer layer 120. The compound semiconductor transistor also may have AlInN/AlN/GaN barrier/spacer/buffer layer structures. In general, the compound semiconductor transistor can be realized using any suitable III-nitride technology such as GaN that permits the formation of opposite polarity inversion regions due to piezoelectric effects. The gate 114 controls the conducting or non-conducting state of the two-dimensional charge carrier gas channel 118. The channel 118 of a normally-off HEMT is disrupted absent a voltage applied to the gate 114, and disrupted in the presence of a suitable gate voltage for a normally-on device. In one embodiment, the first III-nitride semiconductor (buffer layer) 120 comprises GaN, the second III-nitride semiconductor (barrier layer) 122 comprises AlGaN and the doped region 116 of the semiconductor field plate 100 comprises p-doped GaN.

The semiconductor field plate 100 can further comprise an intrinsic (i.e., unintentionally doped) region 128 of the heterostructure body 102 adjacent the doped region 116 of the semiconductor field plate 100 as shown in FIG. 2. The intrinsic region 128 can connect the doped region 116 of the semiconductor field plate 100 to the drain 106/110. In general, the doped region 116 of the semiconductor field plate 100 can be positioned above and/or below the two-dimensional charge carrier gas channel 118.

Figure 3:
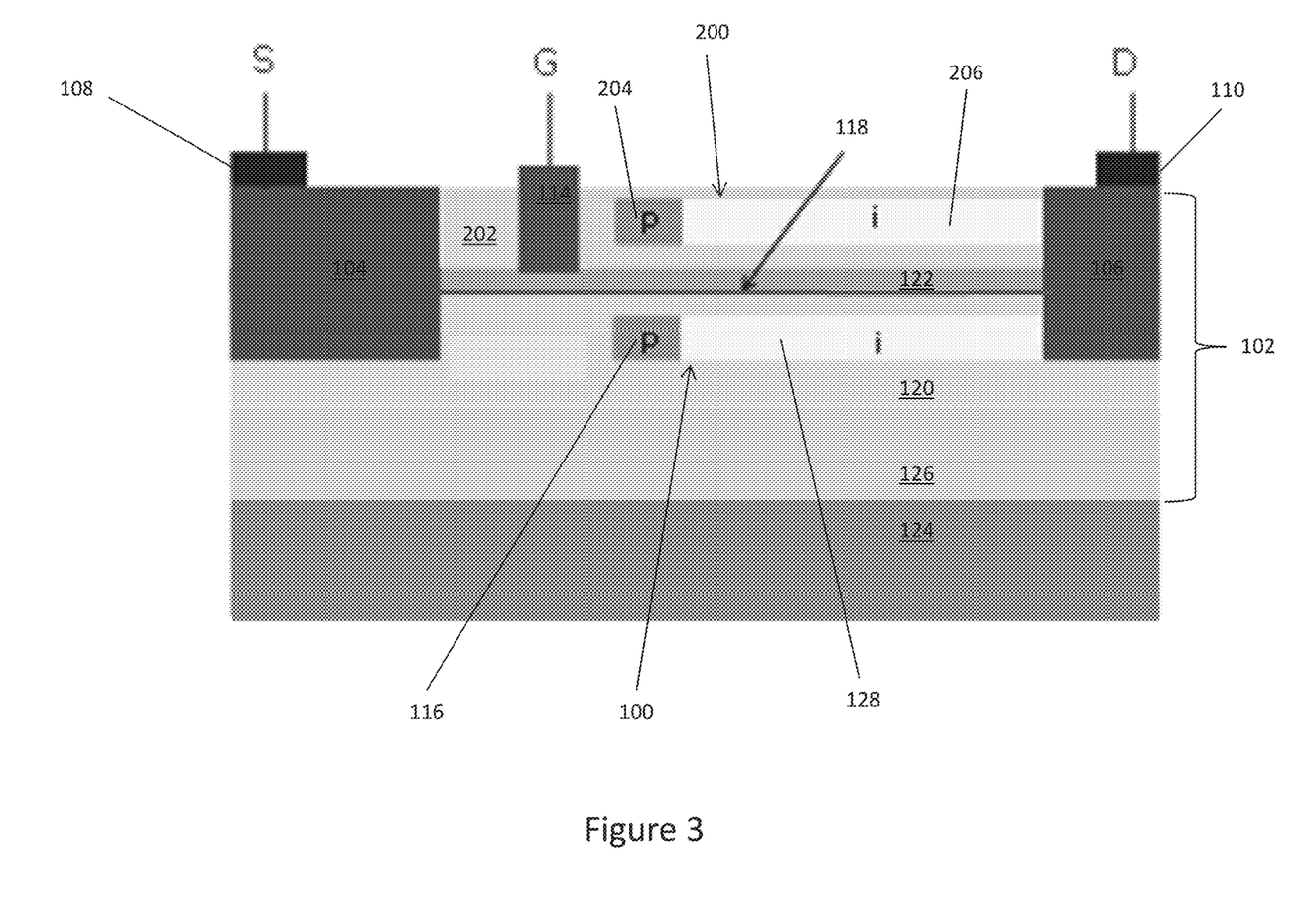
FIG. 3 illustrates a sectional view of another embodiment of a compound semiconductor transistor having two semiconductor field plates with evenly distributed mirror charges.

FIG. 3 illustrates another embodiment of a compound semiconductor transistor having two semiconductor field plates 100, 200 each with evenly distributed mirror charges. The embodiment shown in FIG. 3 is similar to the one shown in FIG. 2, however, the heterostructure body 102 further comprises a third III-nitride semiconductor 202 (e.g. GaN) on the second III-nitride semiconductor 122. An additional semiconductor field plate 200 is formed in the third III-nitride semiconductor 202. The additional semiconductor field plate 200 comprises a doped region 204 of the third III-nitride semiconductor 202. The additional semiconductor field plate 200 can also comprises an intrinsic (i.e., unintentionally doped) region 206 of the third III-nitride semiconductor 202 that is adjacent the doped region 204 of the third III-nitride semiconductor 202. The intrinsic region 206 can connect the doped region 204 of the additional field plate 200 to the drain.

In the blocking state, mobile free charge carriers are forced out of the drain 106/110 to the source 104/108 and the atoms in the drain 106/110 yield a positively charged drain 106/110 as previously described herein. Evenly distributed mirror charges in the form of the fixed dopant atoms in the doped region 204 of the additional field plate 200 at least partly counterbalance the carriers in the drain 106/110 in the blocking state. These mirror charges are immobile and fixed in space because mobile free charge carriers are likewise forced out of the additional field plate 100 in the blocking state such that the additional field plate 200 becomes charged opposite as the drain 106/110. The counterbalance provided by both semiconductor field plates 100, 200 is evenly distributed over the volume of the respective field plates 100, 200, due to the use of respective doped regions 116, 204 in the heterostructure body 102 to provide the desired charge counterbalance effect. The lower semiconductor field plate 100 below the two-dimensional charge carrier gas channel 118 can be provided as shown in FIG. 3, or omitted. The gate 114 can also provide some of the charge counterbalance for the drain 106/110 in the blocking state, but the semiconductor field plate(s) 100, 200 provide the majority of the charge counterbalance so that the electric field buildup near the side of the gate 114 towards the drain 106/110 is minimized.

Figure 4A:
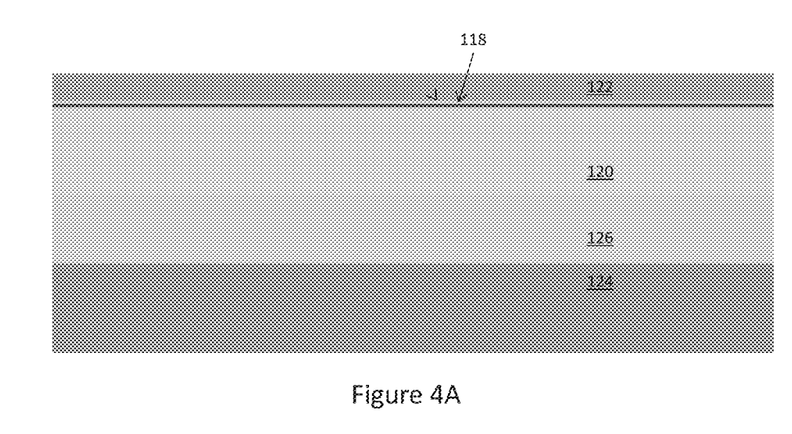
FIGS. 4A through 4C, illustrates an embodiment of a method of manufacturing a compound semiconductor transistor having a semiconductor field plate with evenly distributed mirror charges.
Figure 4B:
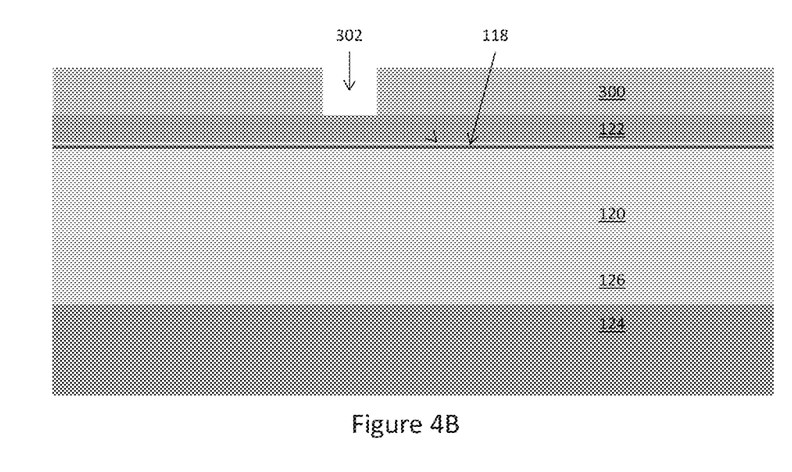
Figure 4C:
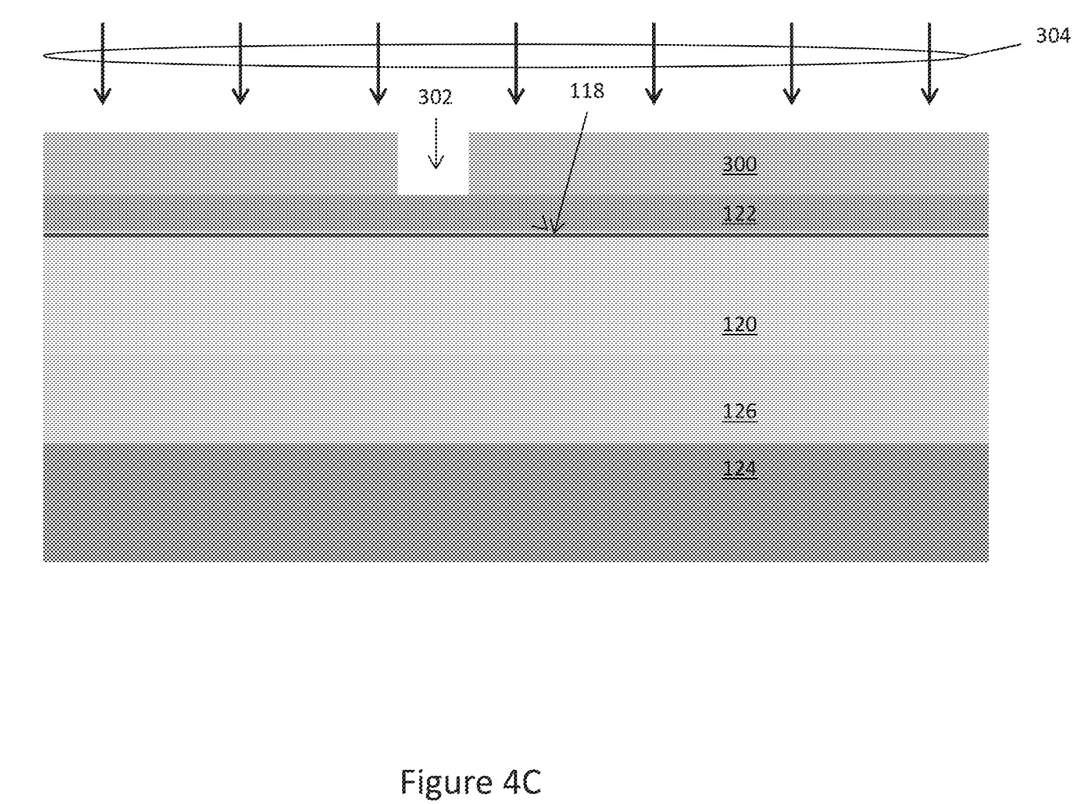

FIG. 4, which includes FIGS. 4A through 4C, illustrates an embodiment of manufacturing a compound semiconductor transistor having a semiconductor field plate with evenly distributed mirror charges.

In FIG. 4A, a nucleation (seed) layer 126 such as an AlN layer is formed on a semiconductor substrate 124 such as a Si or SiC substrate. The nucleation (seed) layer 126 provides thermal and lattice matching for the III-nitride buffer layer 120 such as GaN formed on the substrate 124. A barrier layer 122 such as a GaN alloy barrier layer like AlGaN or InAlGaN is formed on the underlying buffer layer 120. The presence of polarization charges and strain effects in the resulting III-nitride heterostructure body yield a two-dimensional charge carrier gas 118 near the interface between the buffer and barrier layers 120, 122. The two-dimensional charge carrier gas 118 can be a 2DEG or 2DHG depending on the type of transistor, and provides the channel of the transistor.

In FIG. 4B, a mask 300 such as a photoresist mask with an opening 302 is formed on the heterostructure body such that part of the heterostructure body is unprotected by the mask 300.

In FIG. 4C, dopant atoms 304 are introduced into a region of the heterostructure body by implanting the dopant atoms 304 into the part of the heterostructure body unprotected by the mask 300. For example in the case of forming a p-doped region, Mg atoms can be implanted into the part of the heterostructure body unprotected by the mask 300. In the case of forming an n-doped region, Si atoms can be implanted into the part of the heterostructure body unprotected by the mask 300. In either case, the dopant atoms 304 are thermally activated e.g. by annealing the heterostructure body such that the dopant atoms 304 occupy crystal lattice positions within the heterostructure body and form a semiconductor field plate between the source and the drain. The dopant atoms of the semiconductor field plate are configured to at least partly counterbalance opposite charges in the drain when the transistor is in an off state and a blocking voltage is applied to the drain as previously described herein. The field plate, source and drain are not shown in FIGS. 4A through 4C for ease of illustration. An intrinsic region of the field plate is not specifically prepared. The intrinsic region can be of the same kind as the other III-nitride material surrounding the field plate.

Figure 5:
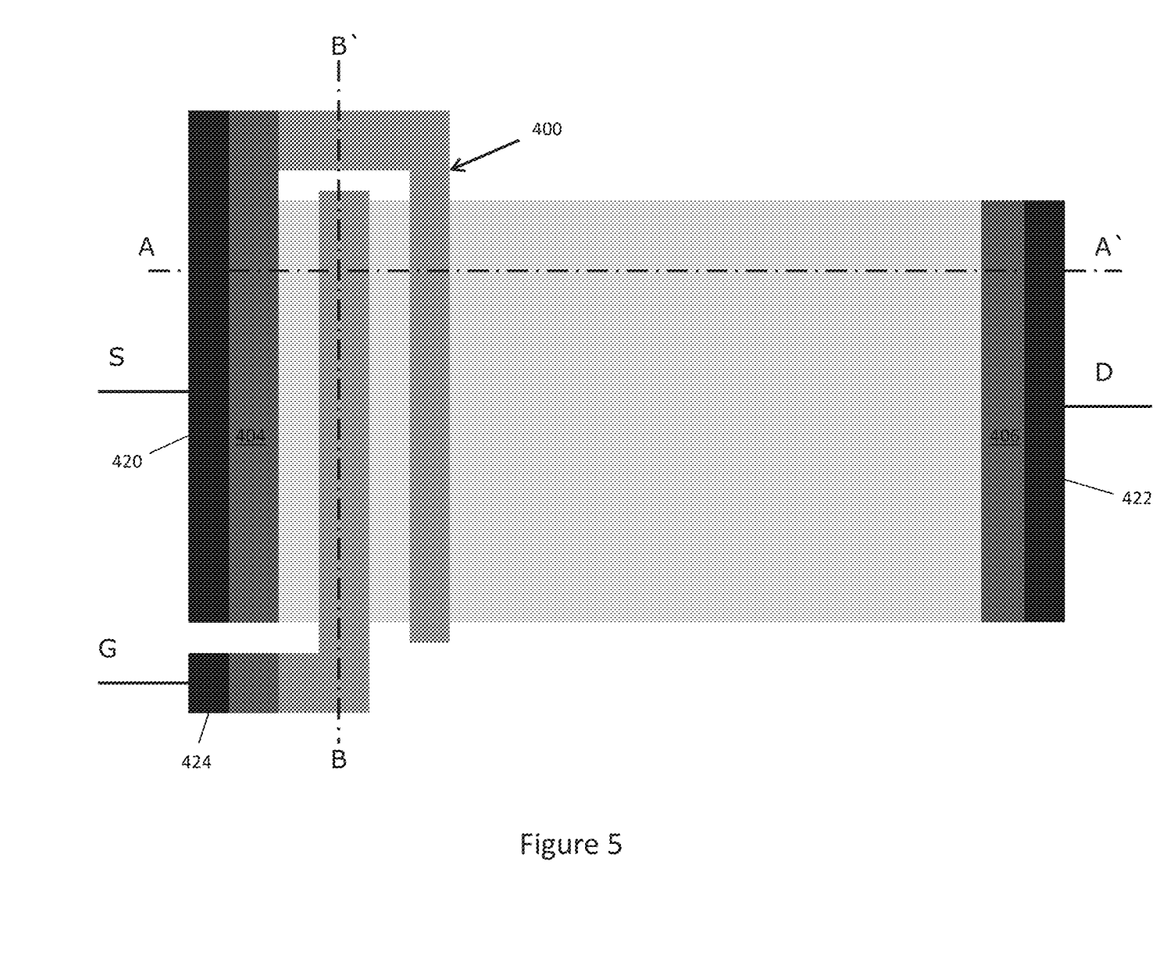
FIG. 5 illustrates a top plan view of another embodiment of a compound semiconductor transistor having a semiconductor field plate with evenly distributed mirror charges.
Figure 6:
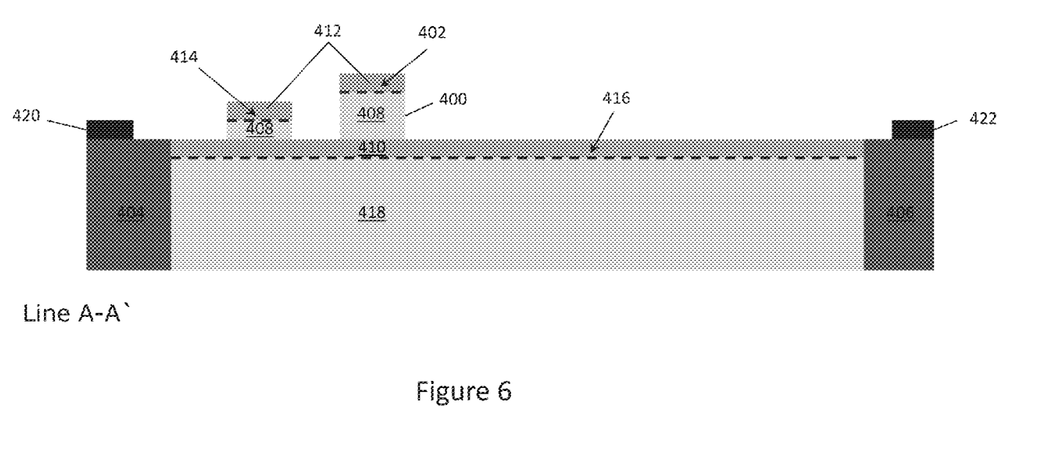
FIG. 6 illustrates a sectional view of the compound semiconductor transistor shown in FIG. 5 along the line labeled A-A'.
Figure 7:
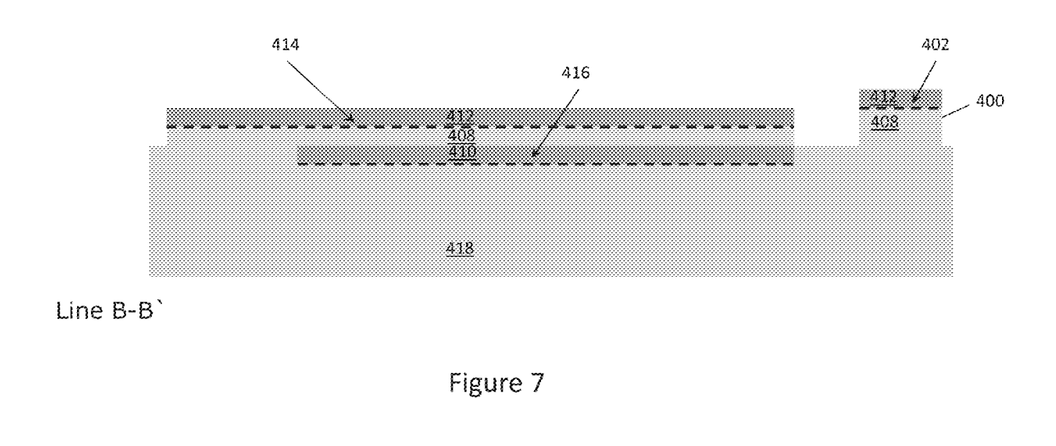
FIG. 7 illustrates a sectional view of the compound semiconductor transistor shown in FIG. 5 along the line labeled B-B'.

FIG. 5 illustrates another embodiment of a compound semiconductor transistor having a semiconductor field plate 400 with evenly distributed mirror charges. FIG. 6 is a sectional view of the transistor along the line labeled A-A' in FIG. 5, and FIG. 7 is a sectional view of the transistor along the line labeled B-B' in FIG. 5. The embodiment shown in FIGS. 5-7 is similar to the one shown in FIGS. 1-2, however, the semiconductor field plate 400 comprises a two-dimensional charge carrier gas 402 (2DEG or 2DHG, depending on device type). According to this embodiment, the semiconductor field plate 400 is formed from a third III-nitride semiconductor 408 on a second III-nitride semiconductor (barrier layer) 410 and a fourth III-nitride semiconductor 412 on the third III-nitride semiconductor 408. The fourth III-nitride semiconductor 412 has a different band gap than the third III-nitride semiconductor 408 such that a two-dimensional charge carrier gas 402, 414 arises along an interface between the third and fourth III-nitride semiconductors 408, 412. For example, GaN can be formed on the barrier layer 410 and AlGaN on the GaN. The two-dimensional charge carrier gas 414 that arises along the interface between the third and fourth III-nitride semiconductors 408, 412 has the same charge type as the two-dimensional charge carrier gas channel 416 that arises along the interface between the barrier and buffer layers 410, 418.

In the blocking state of the transistor, the two-dimensional charge carrier gas 402 of the field plate 400 provides immobile mirror charges that counterbalance the charges of the drain 406 and are distributed over a plane of the field plate 400 according to this embodiment. In the case of an n-channel device, the two-dimensional charge carrier gas 402 of the field plate 400 is a 2DEG. In the case of a p-channel device, the two-dimensional charge carrier gas 402 of the field plate 400 is a 2DHG. In the blocking state of the device, the immobile mirror charges provided by the 2DEG/2DHG 402 counterbalance the charges of the drain 406. As a result, significantly reduced maximum electric fields arise as compared to conventional metallic field electrodes.

The two-dimensional charge carrier gas 402 of the field plate 400 can be connected to a metal contact (not shown) via highly doped zones (also not shown) of the heterostructure body e.g. n+ doped zones in the case of an n-channel device. The highly doped zones and the metal contact of the electrode should not be positioned above the channel zone and the drift zone, respectively. Instead, the highly doped zones and the metal contact of the electrode should be positioned e.g. next to the source electrode 420. Otherwise, the total maximum charge on the field plate 400 would not be independent of the applied voltage and therefore would not be limited by the maximum sheet density of the two-dimensional charge carrier gas 402. In contrast to metal gates or metal field plate electrodes, the maximum sheet density of a 2DEG is limited to $\sim 10^{13}$ cm$^{-2}$. The maximum total charge of such a field plate 400 should thereby be independent of an applied voltage. The maximum total charge could be adjusted e.g. by varying the width of the field plate 400, the thickness of the fourth III-nitride semiconductor 412, the Al concentration of the fourth III-nitride semiconductor 412 e.g. in the case of AlGaN, etc.

An estimation shows that it is possible to accommodate the complete mirror charge needed to counterbalance the charge on the drain electrode 422 in the blocking state and with a voltage applied to the drain 406 of +600V by using a field plate 400 comprising a 2DEG 402 (n=$10^{13}$ cm$^{-2}$, length of the drift region=20 μm; field plate width=1 μm; ϵr=10). As the mirror charge on the two-dimensional charge carrier gas field plate 400 is distributed in a plane rather than being localized in a single point in space as is the case for metal electrodes, the maximum electric field on that side of the field plate 400 facing the drain 406 is reduced drastically.

In a further embodiment, two or more two-dimensional charge carrier gas based field plates can be utilized to reduce the electric field in a step-like manner. In addition or alternatively, the maximum sheet carrier density of any of the field plate arrangements described herein can be engineered in a way such that part of the mirror charge is accommodated by the gate electrode 424 or source and gate electrodes 420, 424. Furthermore, a semiconductor field plate can be positioned both above and below the channel as described previously herein (see FIG. 3, for example).

In addition to having a reduced maximum electric field on that side of a two-dimensional charge carrier gas field plate 400 facing the drain 406, the utilization of a 2DEG gate 414 as shown in FIGS. 6 and 7 turns a usually normally-on HEMT into a normally-off HEMT. Applying a voltage of 0V to the gate 414 causes the negative charges inside the 2DEG 414 to be depleted and the transistor is switched off. Advantageously parameters like layer thickness, Al content of AlGaN layers, etc. can be adjusted in a way that the sheet carrier density of the gate 2DEG 414 is larger than the sheet carrier density inside the channel region 416 of the HEMT. If a positive voltage is applied to the 2DEG gate 414, the negative charges are removed from the gate electrode and the transistor is switched on.

Spatially relative terms such as "under", "below", "lower", "over", "upper" and the like, are used for ease of description to explain the positioning of one element relative to a second element. These terms are intended to encompass different orientations of the package in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A transistor, comprising:
a source;
a drain spaced apart from the source;
a heterostructure body comprising a first III-nitride semiconductor, a second III-nitride semiconductor on the first III-nitride semiconductor and a third III-nitride semiconductor on the second III-nitride semiconductor, the second III-nitride semiconductor having a different band gap than the first III-nitride semiconductor such that a two-dimensional charge carrier gas channel arises along an interface between the first and second III-nitride semiconductors for connecting the source and the drain; and a semiconductor field plate comprising a doped region of the third III-nitride semiconductor that is p-doped.

2. The transistor of claim 1, wherein the semiconductor field plate comprises a two-dimensional charge carrier gas.

3. The transistor of claim 1, further comprising an additional semiconductor field plate which comprises a doped region of the first III-nitride semiconductor that is p-doped.

4. The transistor of claim 1, wherein the semiconductor field plate further comprises an intrinsic region of the third III-nitride semiconductor that is adjacent the doped region of the third III-nitride semiconductor.

5. The transistor of claim 1, wherein the first III-nitride semiconductor comprises GaN, the second III-nitride semiconductor comprises AlGaN, and the two-dimensional charge carrier gas channel is a two-dimensional electron gas channel arising near an interface between the AlGaN and the GaN.

6. The transistor of claim 5, wherein the third III-nitride semiconductor comprises GaN.

7. The transistor of claim 1, wherein:

wherein the semiconductor field plate comprises dopant atoms of an impurity type which provide free carriers; and wherein in the off state of the transistor, the free carriers are forced out of the semiconductor field plate such that the dopant atoms of the semiconductor field plate at least partly counterbalance the oppositely charged drain.

8. A transistor, comprising:

a source;

a drain spaced apart from the source;

a heterostructure body comprising a first III-nitride semiconductor and a second III-nitride semiconductor on the first III-nitride semiconductor, the second III-nitride semiconductor having a different band gap than the first III-nitride semiconductor such that the two-dimensional charge carrier gas channel arises along an interface between the first and second III-nitride semiconductors for connecting the source and the drain; and a semiconductor field plate comprising a third III-nitride semiconductor on the second III-nitride semiconductor and a fourth III-nitride semiconductor on the third III-nitride semiconductor, the fourth III-nitride semiconductor having a different band gap than the third III-nitride semiconductor such that a two-dimensional charge carrier gas arises along an interface between the third and fourth III-nitride semiconductors, wherein the two-dimensional charge carrier gas that arises along the interface between the third and fourth III-nitride semiconductors has the same charge type as the two-dimensional charge carrier gas channel that arises along the interface between the first and second III-nitride semiconductors.

9. The transistor of claim 8, wherein the first III-nitride semiconductor comprises GaN, the second III-nitride semiconductor comprises AlGaN, the third III-nitride semiconductor comprises GaN, and the fourth III-nitride semiconductor comprises AlGaN.

* * * * *